US012805303B2

(12) United States Patent
Xu et al.

(10) Patent No.: US 12,805,303 B2

(45) Date of Patent: Nov. 17, 2026

(54) SEMICONDUCTOR STRUCTURE WITH COVERING LAYER AND AUXILIARY LAYER OVER GATE ELECTRODE AND FORMATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Zengsheng Xu, Shanghai (CN); Xuezhen Jing, Shanghai (CN); Hao Zhang, Shanghai (CN); Tiantian Zhang, Shanghai (CN); Hailong Yu, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 422 days.

(21) Appl. No.: 18/565,406

(22) PCT Filed: May 31, 2021

(86) PCT No.: PCT/CN2021/097156

§ 371 (c)(1),
(2) Date: Nov. 29, 2023

(87) PCT Pub. No.: WO2022/252000

PCT Pub. Date: Dec. 8, 2022

(65) Prior Publication Data

US 2024/0258238 A1 Aug. 1, 2024

(51) Int. Cl.
*H10W 20/44* (2026.01)
*H10P 14/40* (2026.01)

(52) U.S. Cl.
CPC ....... *H10W 20/4441* (2026.01); *H10P 14/418* (2026.01)

(58) Field of Classification Search
CPC ......................... H10W 20/4441; H10P 14/418
See application file for complete search history.

(56) References Cited

U.S. PATENT DOCUMENTS 5,028,565 A * 7/1991 Chang ................. H10W 20/031 438/654

2003/0151098 A1* 8/2003 Nishida ................ H10D 64/691 257/388

(Continued)

*Primary Examiner* — Lex H Malsawma

(74) *Attorney, Agent, or Firm* — Anova Law Group, PLLC

(57) ABSTRACT

A semiconductor structure includes a substrate, a covering layer on the substrate, an auxiliary layer on the covering layer, a first dielectric layer on surfaces of the substrate and the auxiliary layer, and a conductive structure in the first dielectric layer. The semiconductor structure also includes a second dielectric layer on surfaces of the first dielectric layer and the conductive structure, a first opening in the second dielectric layer and the first dielectric layer, and a second opening in the second dielectric layer. The first opening exposes the auxiliary layer, and the second opening exposes the top surface of the conductive structure. A first conductive layer is in the first opening, and a second conductive layer is in the second opening. A growth rate of the first conductive layer over the auxiliary layer is higher than the growth rate of the first conductive layer over the covering layer.

20 Claims, 6 Drawing Sheets

(56) References Cited

U.S. PATENT DOCUMENTS

| | | | | |
|---|---|---|---|---|
| 2005/0023133 | A1* | 2/2005 | Lippitt, III | H10W 20/033 438/680 |
| 2009/0057787 | A1* | 3/2009 | Matsuki | H10D 64/691 257/411 |
| 2011/0042752 | A1* | 2/2011 | Mayuzumi | H10D 84/0186 257/E21.409 |
| 2012/0104471 | A1* | 5/2012 | Chang | H10W 20/031 257/E21.409 |
| 2013/0161754 | A1* | 6/2013 | Su | H10D 84/0167 257/369 |
| 2014/0027822 | A1* | 1/2014 | Su | H10W 20/083 438/653 |
| 2016/0035724 | A1* | 2/2016 | Pradhan | H10D 64/667 257/407 |
| 2016/0141207 | A1* | 5/2016 | Hung | H10D 30/60 438/286 |
| 2020/0135641 | A1* | 4/2020 | Lee | H10D 1/474 |

* cited by examiner

SEMICONDUCTOR STRUCTURE WITH COVERING LAYER AND AUXILIARY LAYER OVER GATE ELECTRODE AND FORMATION METHOD THEREOF

CROSS-REFERENCE TO RELATED APPLICATIONS

This application is a national phase entry under 35 U.S.C § 371 of International Application No. PCT/CN2021/097156, filed on May 31, 2021, the entire content of which is incorporated herein by reference.

TECHNICAL FIELD

The present disclosure generally relates to the field of semiconductor manufacturing technology and, more particularly, relates to a semiconductor structure and a formation method thereof.

BACKGROUND

As integration levels of semiconductor devices continuously increase, critical dimensions of transistors may continuously decrease. Various practical and fundamental limitations and technical challenges begin to emerge, and further reduction in device sizes is becoming increasingly difficult.

The rapid development of integrated circuit technology has put forward higher requirements for metal interconnection technology. Traditional aluminum metal interconnection technology may no longer meet needs of the development of modern interconnection technology. Damascus-structure copper metal interconnection technology has become one of key development directions of interconnection technology. However, as the characteristic line width of integrated circuits shrinks to a few nanometers, copper interconnect technology also faces huge challenges. There are more and more layers of metal wiring, and resistance of metal wires and parasitic capacitance between the metal wires are becoming more and more restrictive factors affecting speeds of devices.

As such, existing metal interconnection line technology needs to be further improved.

SUMMARY

The present disclosure provides a semiconductor structure and a formation method thereof to improve performance of semiconductor structures.

To solve the above technical problems, the present disclosure provides a semiconductor structure. The semiconductor structure includes: a substrate; a covering layer located over part of the substrate; an auxiliary layer located over a surface of the covering layer; a first dielectric layer located over surfaces of the substrate and the auxiliary layer; a conductive structure located in the first dielectric layer, where a top surface of the first dielectric layer is flush with a top surface of the conductive structure; a second dielectric layer located over surfaces of the first dielectric layer and the conductive structure; a first opening located in the second dielectric layer and the first dielectric layer, where the first opening exposes the auxiliary layer, and a second opening located in the second dielectric layer, where the second opening exposes the top surface of the conductive structure; and a first conductive layer located in the first opening, and a second conductive layer located in the second opening.

Optionally, the substrate includes a base, a gate structure located over the base, and an interlayer dielectric layer located over the base, where the interlayer dielectric layer is also located over sidewalls of the gate structure and exposes a top surface of the gate structure, and the covering layer is located over the top surface of the gate structure.

Optionally, the substrate also includes a source/drain layer located in the substrate on two sides of the gate structure, where a bottom of the conductive structure is deep into the substrate and is located over a surface of the source/drain layer.

Optionally, a material of the covering layer includes metal.

Correspondingly, the present disclosure also provides a method of forming a semiconductor structure. The method includes: providing a substrate; forming a covering layer over part of the substrate; using a first selective deposition process to form an auxiliary layer over a surface of the covering layer; forming a first dielectric layer over surfaces of the substrate and the auxiliary layer; forming a conductive structure in the first dielectric layer, where a top surface of the first dielectric layer is flush with a top surface of the conductive structure; forming a second dielectric layer over surfaces of the first dielectric layer and the conductive structure; forming a first opening and a second opening, where the first opening is located in the second dielectric layer and the first dielectric layer, and the first opening exposes the auxiliary layer, and the second opening is located in the second dielectric layer and the second opening exposes the top surface of the conductive structure; and forming a first conductive layer in the first opening and forming a second conductive layer in the second opening, where a growth rate of a material of the first conductive layer over the surface of the auxiliary layer is higher than the growth rate of the material of the first conductive layer over the surface of the covering layer.

Optionally, a material of the auxiliary layer includes tungsten.

Optionally, a process of forming the auxiliary layer includes a chemical vapor deposition process; and process parameters of the chemical vapor deposition process include: reaction gas includes tungsten hexafluoride and hydrogen, and reaction temperature ranges from 300 degrees Celsius to 400 degrees Celsius.

Optionally, the substrate includes a base, a gate structure located over the base, and an interlayer dielectric layer located over the base, where the interlayer dielectric layer is also located over sidewalls of the gate structure and exposes a top surface of the gate structure, and the covering layer is located over the top surface of the gate structure.

Optionally, the substrate further includes a source/drain layer located in the substrate on two sides of the gate structure, where a bottom of the conductive structure is deep into the substrate and is located over a surface of the source/drain layer.

Optionally, the covering layer includes first ions, a material of the covering layer includes metal ions, the first ions and the metal ions form first chemical bonds; the auxiliary layer includes the metal ions and second ions, the second ions and the metal ions form second chemical bonds, and bond energy of the second chemical bonds is lower than bond energy of the first chemical bonds.

Optionally, the first ions include chloride ions, and the second ions include fluoride ions.

Optionally, the metal includes tungsten.

Optionally, a process of forming the covering layer includes a selective atomic layer deposition process.

Optionally, process parameters of the atomic layer deposition process include: reaction gas includes tungsten chloride and hydrogen, and reaction temperature ranges from 400 degrees Celsius to 500 degrees Celsius.

Optionally, a process of forming the first conductive layer and the second conductive layer includes a second selective deposition process.

Optionally, process parameters of the second selective deposition process include: reaction gas includes tungsten hexafluoride and hydrogen, and reaction temperature ranges from 300 degrees Celsius to 400 degrees Celsius.

Optionally, a process of forming the first conductive layer and the second conductive layer includes: depositing a conductive material layer in the first opening and the second opening until the first opening and the second opening are fully filled; and planarizing the conductive material layer until the second dielectric layer is exposed.

Optionally, a growth rate of the conductive material layer over the surface of the auxiliary layer is higher than a growth rate of the conductive material layer over the surface of the conductive structure.

Optionally, a material of the first conductive layer and the second conductive layer includes tungsten.

Optionally, a thickness of the auxiliary layer ranges from 1 nanometer to 10 nanometers.

Optionally, a material of the conductive structure includes cobalt.

Compared with the existing technology, the technical solution of the present disclosure has the following advantages.

In the formation method provided by the present disclosure uses uses a first selective deposition process to form an auxiliary layer over the surface of the covering layer. A first conductive layer is formed in the first opening, and a second conductive layer is formed in the second opening. The growth rate of the first conductive layer material over the surface of the auxiliary layer is higher than the growth rate of the first conductive layer material over the surface of the covering layer. Accordingly, the difference between the growth rate of the material of the first conductive layer in the first opening over the surface of the auxiliary layer and the growth rate of the material of the second conductive layer in the second opening over the surface of the conductive structure may be reduced. As such, the chance that the first opening on the auxiliary layer is closed in advance before being fully filled may be reduced, and the performance of the semiconductor structure formed may be improved.

Further, the covering layer includes first ions. The material of the covering layer includes metal ions. First chemical bonds may be formed between the first ions and the metal ions. The auxiliary layer includes metal ions and second ions. The second ions and the metal ions form second chemical bonds, and the second chemical bond energy is lower than the first chemical bond energy. The second chemical bonds are easier to break than the first chemical bonds. Accordingly, the rate of the reaction that subsequently forms the material of the first conductive layer over the surface of the auxiliary layer may be improved.

Further, the first ions include chloride ions and the second ions include fluoride ions. The auxiliary layer includes tungsten-fluorine bonds. The existence of tungsten-fluorine bonds provides preparation for the formation of tungsten material, shortening the time for adsorbing tungsten hexafluoride gas during the process of forming the first conductive layer. The growth rate of the tungsten material formed over the surface of the auxiliary layer may be increased, and the growth rate of the tungsten material in the first opening may be higher than the growth rate of the tungsten material in the second opening. Accordingly, the chance that the first opening may be closed in advance before being fully filled may be reduced, and the performance of the semiconductor structure formed may thus be improved.

DETAILED DESCRIPTION

It should be noted that terms "surface" and "over" in the present disclosure are used to describe relative positional relationships in space, and are not limited to direct contact.

As mentioned in the background, performance of semiconductor structures formed using existing metal interconnection line technology needs to be improved urgently. Explanation and analysis will now be made in conjunction with a method of forming a semiconductor structure.

FIGS. 1-5 illustrate schematic cross-sectional views corresponding to certain stages of a process of forming a semiconductor structure.

Figure 1:
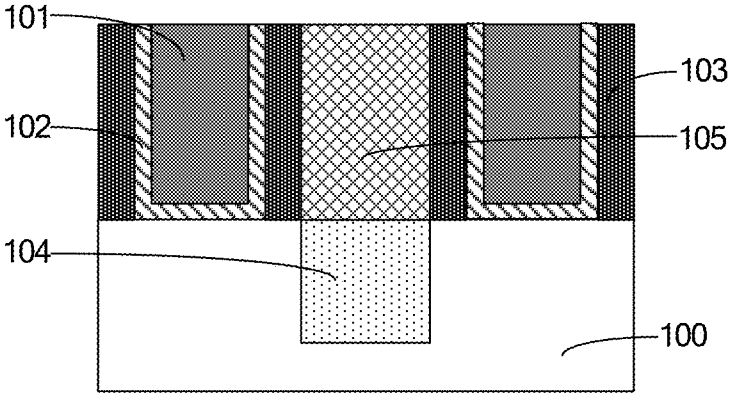
FIGS. 1-5 illustrate schematic cross-sectional views corresponding to certain stages of a process of forming a semiconductor structure.

Referring to FIG. 1, the process includes proving a substrate 100. A gate structure is disposed on the substrate 100. The gate structure includes a metal gate 101 and a gate dielectric layer 102. A spacer 103 is disposed on a sidewall of the gate structure. A source/drain region 104 is disposed in the substrate 100 on two sides of the spacers 103. An interlayer dielectric layer 105 is disposed on the substrate 100. The interlayer dielectric layer 105 is located on the sidewalls of the spacers 103 and exposes the top surface of the gate structure.

Figure 2:
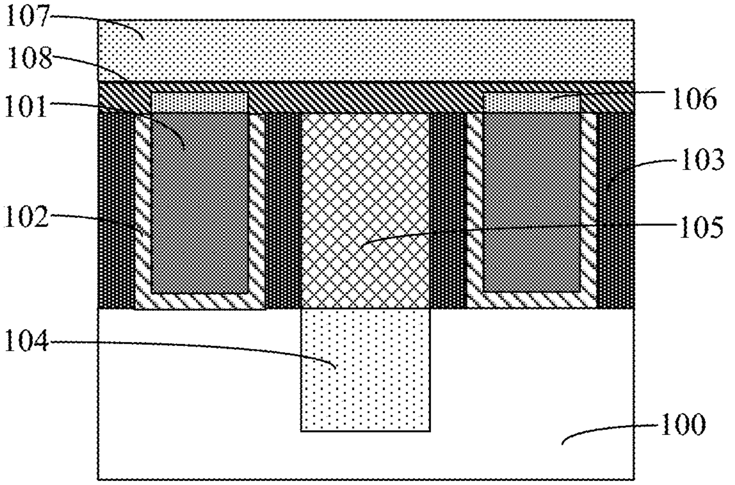

Referring to FIG. 2, the process also includes forming a covering layer 106 over the surface of the metal gate 101; forming a first etch stop layer 108 over the interlayer dielectric layer 105, the surface of the gate structure and the top of the spacer 102; and forming a first dielectric layer 107 over the surface of the first etching stop layer 108.

Figure 3:
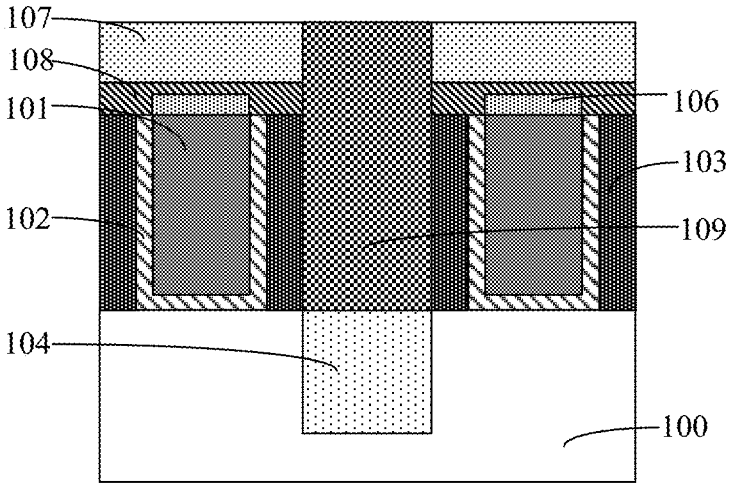

Referring to FIG. 3, the process also includes forming a first opening (not marked in FIG. 3) in the first dielectric layer 107, the first etch stop layer 108 and the interlayer dielectric layer 105, the first opening exposing the source/drain regions 104; and forming a conductive structure 109 within the first opening.

Figure 4:
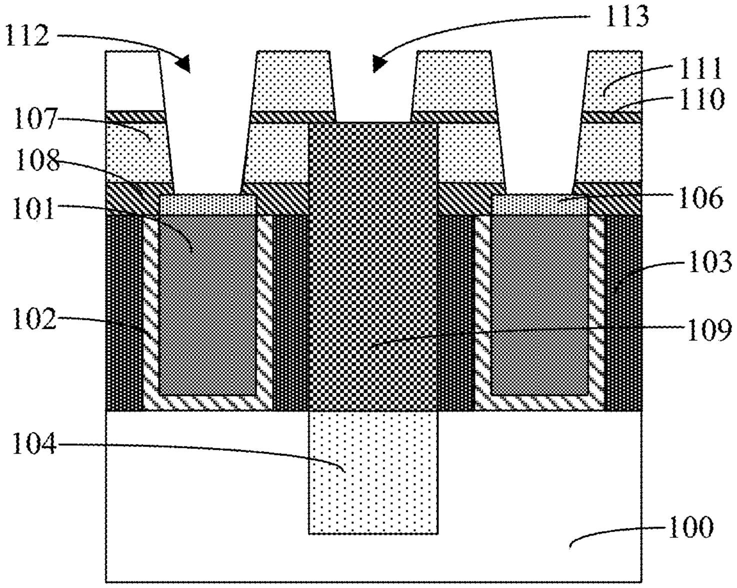

Referring to FIG. 4, the process also includes forming a second etching stop layer 110 over the surface of the conductive structure 109 and the first dielectric layer 107; forming a second dielectric layer 111 over the surface of the second etching stop layer 110; forming a second opening 112 in the second dielectric layer 111, the second etching stop layer 110, the first dielectric layer 107 and the first etching stop layer 108, the second opening 112 exposing the top surface of the covering layer 106; forming a third opening 113 in the second dielectric layer 111 and the second etching stop layer 110, the third opening 113 exposing the top surface of the conductive structure 109.

Figure 5:
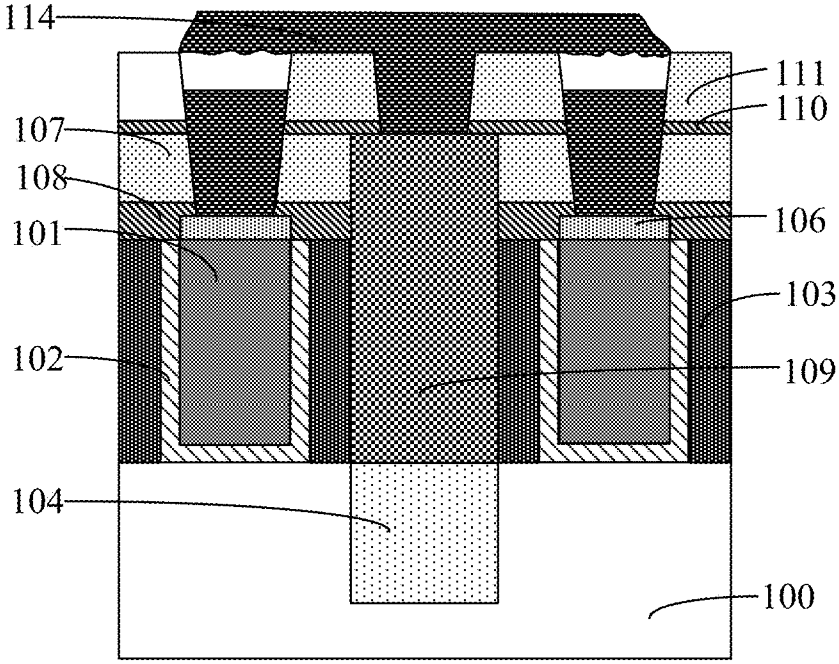

Referring to FIG. 5, the process also includes forming a metal layer 114 in the second opening 112 and the third opening 113.

The above process may be used in metal interconnection line technology. The covering layer 106 may be made of tungsten and may be formed using an atomic layer deposition (ALD) process. The metal tungsten formed may have good selectivity over the surface of the metal gate 101, and the covering layer 106 formed may have good uniformity and good density. The atomic layer deposition process does not contain fluorine ions to avoid adverse effects of fluorine ions over the work function layer of the gate structure, but the deposition rate may be low. The conductive structure 109 is made of cobalt. The material of the metal layer 114 is also tungsten. Since a chemical vapor deposition (CVD) process may have better step coverage and takes less time than the atomic layer deposition process, the metal layer 114 may be formed using the chemical vapor deposition process.

However, since the atomic layer deposition process uses reaction between tungsten chloride (such as $WCl_3$) and hydrogen, the covering layer 106 may have a large number of tungsten-chlorine bonds. In the atomic layer deposition process, the reaction temperature of the reaction between tungsten chloride and hydrogen is 460 degrees Celsius. In the process of forming the metal layer 114 using the chemical vapor deposition process, metal tungsten selectively grows over the surface of the metal material. The reaction gases include tungsten hexafluoride and hydrogen, and the reaction temperature is below 400 degrees Celsius. Under conditions below 400 degrees Celsius, the large number of tungsten-chlorine bonds present in the covering layer 106 are more stable than the tungsten-fluorine bonds in the reaction gas tungsten hexafluoride. The existence of the tungsten-chlorine bonds may make it difficult to form a tungsten material film in the chemical vapor deposition process. As such, a growth rate of tungsten material over the surface of the covering layer 106 may be much lower than a growth rate of tungsten material over the surface of the conductive structure 109. In addition, the depth of the second opening 112 is greater than the depth of the third opening 113. Furthermore, after the third opening 113 is fully filled with tungsten material, the second opening 112 may not be fully filled with tungsten material. After the third opening 113 is fully filled, the tungsten material may continue to grow and may cover the surface of the second opening 112, causing the second opening 112 to be closed in advance. As a result, defects such as holes may appear in the metal layer 114 formed in the second opening 112, affecting the conductive performance of the metal layer 114 and lowering the performance of the semiconductor structure formed.

To solve the above problems, the present disclosure provides a method of forming a semiconductor structure. The method uses a first selective deposition process to form an auxiliary layer over the surface of the covering layer. A first conductive layer is formed in the first opening, and a second conductive layer is formed in the second opening. The growth rate of the first conductive layer material over the surface of the auxiliary layer is higher than the growth rate of the first conductive layer material over the surface of the covering layer. Accordingly, the difference between the growth rate of the material of the first conductive layer in the first opening over the surface of the auxiliary layer and the growth rate of the material of the second conductive layer in the second opening over the surface of the conductive structure may be reduced. As such, the chance that the first opening over the auxiliary layer is closed in advance before being fully filled may be reduced, and the performance of the semiconductor structure formed may be improved.

To make the above objects, features and beneficial effects of the present disclosure more obvious and understandable, specific embodiments of the present disclosure will be described in detail below with reference to the accompanying drawings.

FIGS. 6-12 illustrate structural schematics corresponding to certain stages of a method of forming a semiconductor structure, consistent with the disclosed embodiments of the present disclosure.

Figure 6:
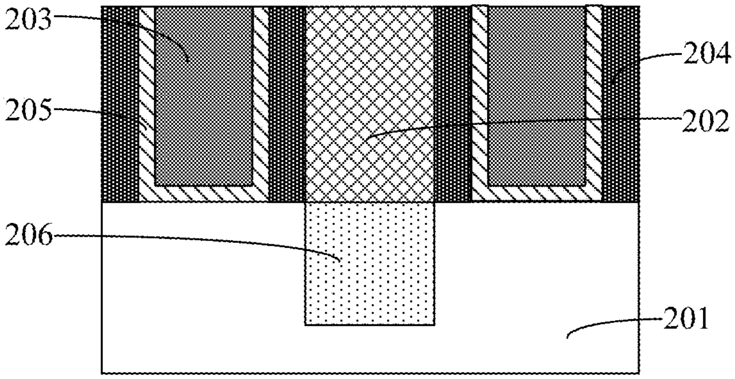
FIGS. 6-12 illustrate structural schematics corresponding to certain stages of a method of forming a semiconductor structure, consistent with the disclosed embodiments of the present disclosure.

Referring to FIG. 6, the method includes providing a substrate.

In one embodiment, the substrate includes a base 201, a gate structure located over the base 201, and an interlayer dielectric layer 202 located over the base 201. The interlayer dielectric layer 202 is also located over sidewalls of the gate structure and exposes a top surface of the gate structure.

The gate structure includes a gate layer 203 and a spacer 204 located over a sidewall of the gate layer 203.

The gate layer 203 is made of metal. In one embodiment, the gate layer 203 is made of aluminum.

A process of forming the gate structure includes: forming a dummy gate (not marked in FIG. 6) over the base 201; forming the spacer 204 over a sidewall of the dummy gate; forming the interlayer dielectric layer 202 over the surface of the base 201, the interlayer dielectric layer 202 exposing the top surface of the dummy gate; etching away the dummy gate to form a groove (not marked in FIG. 6) in the interlayer dielectric layer 202; and forming the gate layer 203 within the groove.

In one embodiment, after forming the groove and before forming the gate layer 203, a gate dielectric layer 205 is also formed over the side walls and bottom of the groove. The material of the gate dielectric layer 205 includes a high-K dielectric material.

In one embodiment, the gate structure also includes a work function layer (not marked in FIG. 6) located between the gate dielectric layer 205 and the gate layer 203.

In one embodiment, the substrate 200 also includes a source/drain layer 206 located in the base 201 on two sides of the gate structure.

Figure 7:
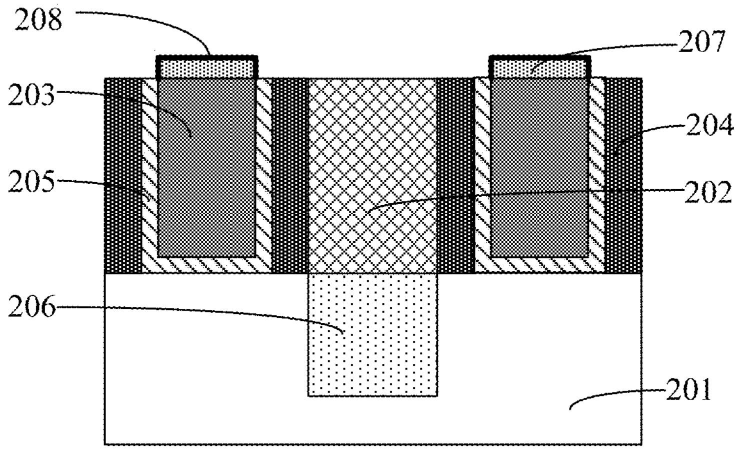

Referring to FIG. 7, the method also includes forming a covering layer 207 over a part of the substrate; and using a first selective deposition process to form an auxiliary layer 208 over a surface of the covering layer 207.

The auxiliary layer 208 may be used to subsequently increase a growth rate of the material of the first conductive layer over the covering layer 207.

In one embodiment, the covering layer 207 is located over the top surface of the gate structure 202. Specifically, the covering layer 207 is located over the top surface of the gate layer 203. The covering layer 207 may be used to block the diffusion of ions into the gate layer 203, and thus the threshold voltage and other properties of the device formed may be maintained.

The material of the covering layer 207 includes metal, and the metal includes tungsten. In one embodiment, the metal is tungsten.

A process of forming the covering layer 207 includes a selective atomic layer deposition process.

In one embodiment, process parameters of the atomic layer deposition process include: the reaction gas includes tungsten chloride and hydrogen, and the reaction temperature ranges from 400 degrees Celsius to 500 degrees Celsius. Tungsten chloride reacts with hydrogen to form tungsten. The selective atomic layer deposition process may make the tungsten material have good selectivity over the surface of the gate layer 203 and a uniform and dense material film may be formed. The process of forming the covering layer 207 does not include fluorine ions to avoid the adverse effects of fluorine ions over the work function layer of the gate structure. However, limited by the atomic layer deposition process, the deposition rate may be slow.

The covering layer 207 includes first ions. The material of the covering layer 207 includes metal ions. First chemical bonds may be formed between the first ions and the metal ions.

Specifically, the first ions include chloride ions. In one embodiment, the covering layer 207 is formed by the reaction of tungsten chloride and hydrogen, and chloride ions are thus introduced into the covering layer 207. The first ions are chloride ions. In addition, the material of the covering layer 207 includes tungsten ions, and the first chemical bonds formed between chlorine ions and tungsten ions are tungsten-chlorine bonds. The tungsten-chlorine bonds are not easily broken compared to the tungsten-fluorine bonds. When tungsten hexafluoride and hydrogen are reacted over the surface of the covering layer 207 to form the first conductive layer of tungsten material, the growth of the tungsten material may become difficult due to the presence of tungsten-chlorine bonds.

The auxiliary layer 208 includes metal ions and second ions. The second ions and the metal ions form second chemical bonds, and the second chemical bond energy is lower than the first chemical bond energy. The second chemical bonds are easier to break than the first chemical bonds. Accordingly, the rate of the reaction that subsequently forms the material of the first conductive layer over the surface of the auxiliary layer 208 may be improved.

Specifically, the material of the auxiliary layer 208 includes tungsten; and the second ions include fluorine ions. In one embodiment, the material of the auxiliary layer 208 is tungsten; and the second ions are fluorine ions.

A process of forming the auxiliary layer 208 includes a chemical vapor deposition process. Process parameters of the chemical vapor deposition process include: the reaction gas includes tungsten hexafluoride and hydrogen, and the reaction temperature ranges from 300 degrees Celsius to 400 degrees Celsius.

Specifically, in one embodiment, the auxiliary layer 208 includes tungsten-fluorine bonds, and the covering layer 207 includes chlorine-tungsten bonds. Since the bond energy of the tungsten-fluorine bonds is lower than the bond energy of the chlorine-tungsten bonds, compared to forming the first conductive layer over the surface of the covering layer 207, growing the tungsten material over the surface of the auxiliary layer 208 is relatively easy.

The thickness of the auxiliary layer 208 ranges from 1 nanometer to 10 nanometers. In a subsequent etching process of forming the first opening to expose the auxiliary layer 208, the auxiliary layer 208 may be damaged. When the thickness of the auxiliary layer 208 is too small (i.e., less than 1 nanometer), the auxiliary layer 208 may be consumed and become ineffective. When the thickness of the auxiliary layer 208 is too large, that is, greater than 10 nanometers, on the one hand, the surface of the first dielectric layer 210 material film subsequently formed over the substrate surface may be uneven, affecting device performance, and on the other hand, unnecessary process waste may be caused.

Figure 8:
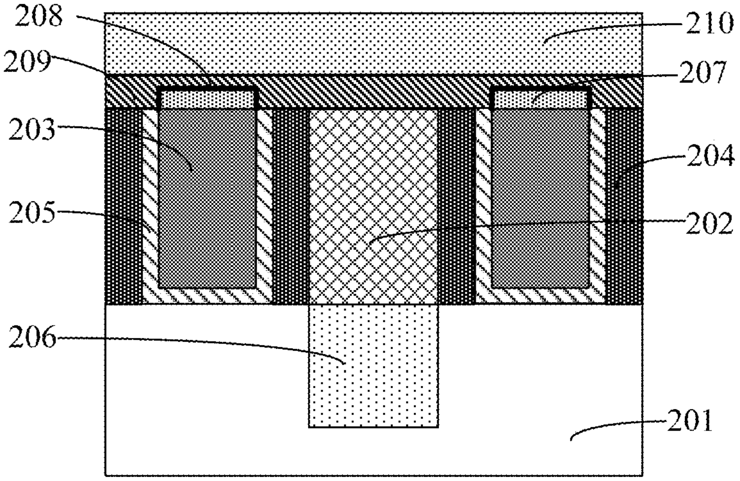

Referring to FIG. 8, the method also includes forming a first dielectric layer 210 over the surface of the substrate and the auxiliary layer 208.

The material of the first dielectric layer 210 is a dielectric material. The dielectric material includes one or more of silicon oxide, silicon nitride, silicon oxynitride, silicon oxycarbide, silicon carbonitride and silicon oxynitride.

In one embodiment, before forming the first dielectric layer 210, a first etch stop layer 209 is also formed over the surface of the substrate and the auxiliary layer 208. When the first opening is subsequently formed, the first etch stop layer 209 may be used to reduce etching damage to the auxiliary layer 208.

Figure 9:
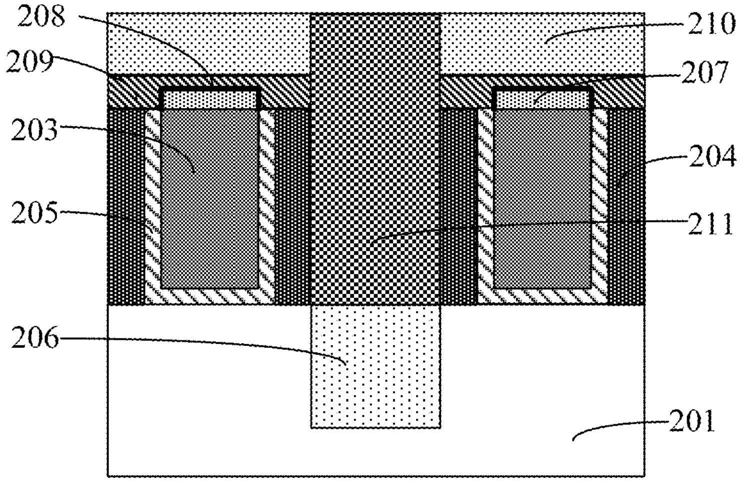

Referring to FIG. 9, the method also includes forming a conductive structure 211 in the first dielectric layer 210. The top surface of the first dielectric layer 210 is flush with the top surface of the conductive structure 211.

In one embodiment, the bottom of the conductive structure 211 is deep into the substrate and is located over the surface of the source/drain layer 206.

A process of forming the conductive structure 211 includes: forming a first patterned layer (not shown in FIG. 9) over the surface of the first dielectric layer 210, the first patterned layer exposing part of the first dielectric layer 210; using the first patterned layer as a mask to etch the first dielectric layer 210, the first etch stop layer 209, and the interlayer dielectric layer 202 until the surface of the source/drain layer 206 is exposed; forming a third opening (not marked in FIG. 9) in the first dielectric layer, the first etch stop layer 209 and the interlayer dielectric layer 206; and depositing metal material in the third opening to form the conductive structure 211.

The conductive structure 211 is made of cobalt. As a wire material, cobalt material has good filling capacity and conductivity, making the device formed have high conductivity and low power consumption.

Figure 10:
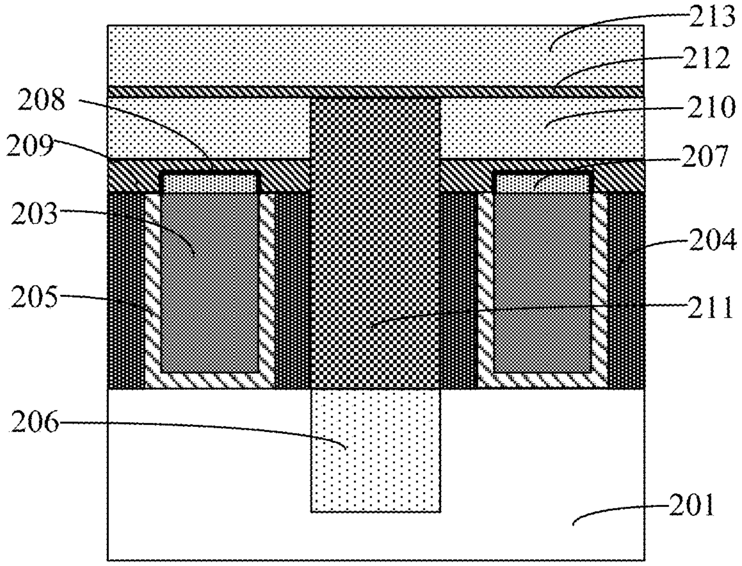

Referring to FIG. 10, the method also includes forming a second dielectric layer 213 over the surface of the first dielectric layer 210 and the conductive structure 211.

The material of the second dielectric layer 213 is a dielectric material. The dielectric material includes one or more of silicon oxide, silicon nitride, silicon oxynitride, silicon oxycarbide, silicon carbonitride and silicon oxynitride.

In one embodiment, before forming the second dielectric layer 213, a second etching stop layer 212 is also formed over the surface of the first dielectric layer 210 and the conductive structure 211. When subsequently forming a second opening, the second etching stop layer 212 may be used to reduce etching damage to the conductive structure 211.

Figure 11:
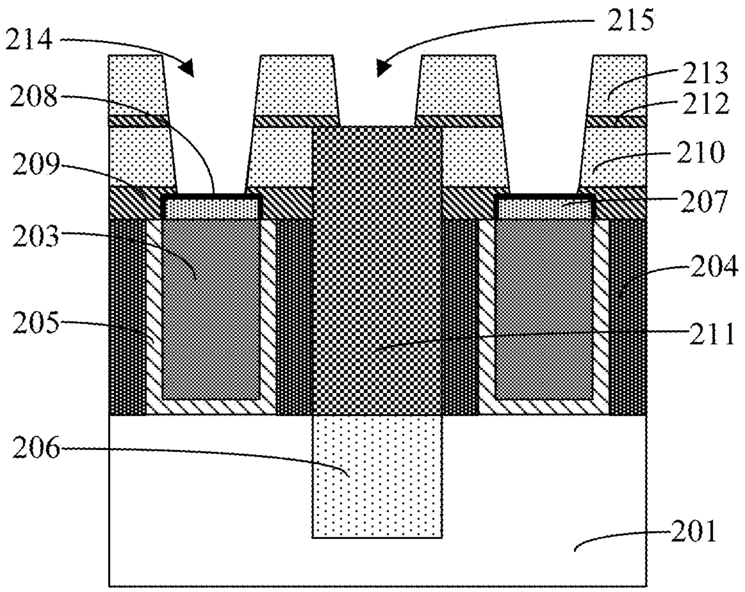

Referring to FIG. 11, the method also includes forming a first opening 214 and a second opening 215. The first opening 214 is located in the second dielectric layer 213 and the first dielectric layer 210, and the first opening 214 exposes the auxiliary layer 208. The second opening 215 is located in the second dielectric layer 213, and the second opening 215 exposes the top surface of the conductive structure 211.

A process of forming the first opening 214 includes a dry etching process; and a process of forming the second opening 215 includes a dry etching process. By using the dry etching process, openings with good morphology may be formed.

In one embodiment, a process of forming the second opening 215 includes: forming a second patterned layer over the surface of the second dielectric layer 213, the second patterned layer exposing part of the second dielectric layer 213 over the conductive structure 211; and using the second patterned layer as a mask to etch the second dielectric layer 213 until the conductive structure 211 is exposed.

In one embodiment, a process of forming the first opening 214 includes: forming a third patterned layer on the surface of the second dielectric layer 213 and in the second opening 215, the third patterned layer exposing part of the second dielectric layer 213 on the auxiliary layer 208; using the third patterned layer as a mask to etch the second dielectric layer 213 and the first dielectric layer 210 until the auxiliary layer 208 is exposed; and after the auxiliary layer 208 is exposed, removing the third patterned layer. In one embodiment, the first opening 214 is formed after the second opening 215 is formed. In some other embodiments, the sequence of forming the first opening 214 and forming the second opening 215 is not limited.

Figure 12:
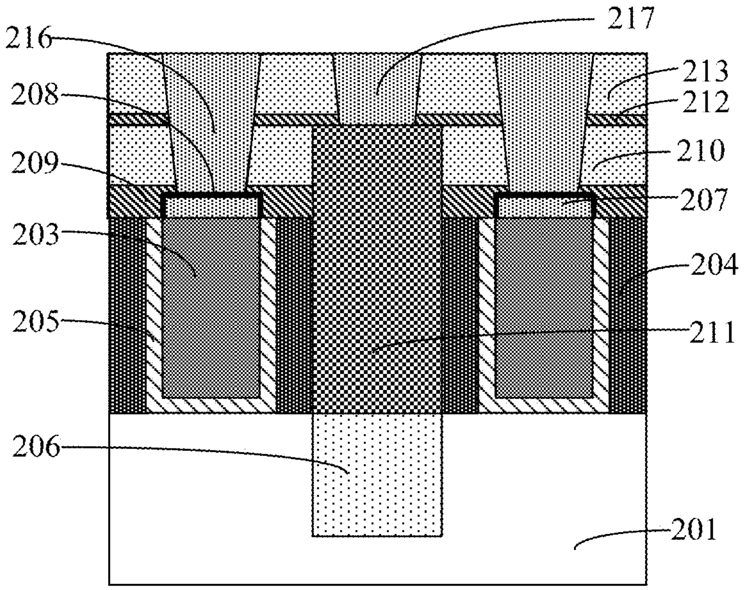

Referring to FIG. 12, the method also includes forming a first conductive layer 216 in the first opening 214 and forming a second conductive layer 217 in the second opening 215. A growth rate of the material of the first conductive layer 216 over the surface of the auxiliary layer 208 is higher than a growth rate of the material of the first conductive layer 216 over the surface of the covering layer 207.

Since the growth rate of the material of the first conductive layer 216 over the surface of the auxiliary layer 208 is higher than the growth rate of the material of the first conductive layer 216 over the surface of the covering layer 207, the difference between the growth rate of the material of the first conductive layer 216 in the first opening 214 and the growth rate of the material of the second conductive layer 217 in the second opening 215 may be reduced. As such, the chance that the first opening 214 over the auxiliary layer 208 is closed in advance before being fully filled may be reduced, and the performance of the semiconductor structure formed may thus be improved.

The material of the first conductive layer 216 and the second conductive layer 217 includes tungsten.

A process of forming the first conductive layer 216 and the second conductive layer 217 includes: depositing a conductive material layer (not marked in FIG. 12) in the first opening 214 and the second opening 215 until the first opening 214 and the second opening 215 are fully filled; and planarizing the conductive material layer until the second dielectric layer 213 is exposed. The first conductive layer 216 and the second conductive layer 217 may be deposited simultaneously using a same metal material and in a same process, and production costs may thus be reduced.

The process of forming the first conductive layer 216 and the second conductive layer 217 includes a second selective deposition process. Specifically, the process of forming the first conductive layer 216 and the second conductive layer 217 includes a chemical vapor deposition process. The chemical vapor deposition process may have good step coverage. Compared to the atomic layer deposition process, the chemical vapor deposition may take less time and have lower costs.

Process parameters of the second selective deposition process include: the reaction gas includes tungsten hexafluoride and hydrogen, and the reaction temperature ranges from 300 degrees Celsius to 400 degrees Celsius.

The growth rate of the conductive material layer over the surface of the auxiliary layer 208 is higher than the growth rate over the surface of the conductive structure 211. Since the depth of the first opening 214 is greater than the depth of the second opening 215, the first opening 214 may not be fully filled. After the second opening 215 is fully filled, further deposition may make the material of the second conductive layer in the second opening 215 continue to grow. As such, the first opening 214 may be covered, causing the first opening 214 to be closed in advance. In one embodiment, the auxiliary layer 208 includes tungsten-fluorine bonds. The existence of tungsten-fluorine bonds provides preparation for the formation of tungsten material, shortening the time for adsorbing tungsten hexafluoride gas during the process of forming the first conductive layer. The growth rate of the tungsten material formed over the surface of the auxiliary layer 208 may be increased, and the growth rate of the tungsten material in the first opening 214 may be higher than the growth rate of the tungsten material in the second opening 215. Accordingly, the chance that the first opening 214 may be closed in advance before being fully filled may be reduced, and the performance of the semiconductor structure formed may thus be improved.

Correspondingly, the present disclosure also provides a semiconductor structure formed by the method provided by the present disclosure. With continuous reference to FIG. 12, the semiconductor structure includes: a substrate; a covering layer 207 located over part of the substrate; an auxiliary layer 208 located over the surface of the covering layer 207; a first dielectric layer 210 located over the surface of the substrate and the auxiliary layer 208; a conductive structure 211 located in the first dielectric layer 210, where a top surface of the first dielectric layer 210 is flush with a top surface of the conductive structure 211; a second dielectric layer 213 located over surfaces of the first dielectric layer 210 and the conductive structure 211; a first opening 214 (as shown in FIG. 11) located in the second dielectric layer 213 and the first dielectric layer 210, where the first opening 214 exposes the auxiliary layer 208; a second opening 215 located in the second dielectric layer 213 (as shown in FIG. 11), where the second opening 215 exposes the top surface of the conductive structure 211; a first conductive layer 216 located in the first opening 214; and a second conductive layer 217 located in the second opening 215.

The substrate includes a base 201, a gate structure located over the base 201, and an interlayer dielectric layer 211 located over the base 201 (as shown in FIG. 11). The interlayer dielectric layer 211 is also located over sidewalls of the gate structure and exposes the top surface of the gate structure. The covering layer 207 is located over the top surface of the gate structure.

The substrate also includes a source/drain layer 206 located in the substrate on two sides of the gate structure. The bottom of the conductive structure 211 is deep into the substrate and is located over the surface of the source/drain layer 206.

The material of the covering layer 207 includes metal, and the metal includes tungsten. In one embodiment, the material of the covering layer 207 is tungsten.

Although the present disclosure has been disclosed above, the present disclosure may not be limited thereto. Changes and modifications may be made by those skilled in the art without departing from the spirit and scope of the present disclosure. Therefore, the scope of the present disclosure should be determined by the scope defined by appended claims.

What is claimed is:

1. A semiconductor structure, comprising:

a substrate;

a gate structure located over the substrate;

a covering layer located over a part of the substrate, the covering layer located over a top surface of the gate structure and being in contact with the top surface of the gate structure;

an auxiliary layer located over a surface of the covering layer;

a first dielectric layer located over surfaces of the substrate and the auxiliary layer;

a conductive structure located in the first dielectric layer, wherein a top surface of the first dielectric layer is flush with a top surface of the conductive structure;

a second dielectric layer located over surfaces of the first dielectric layer and the conductive structure;

a first opening located in the second dielectric layer and the first dielectric layer, wherein the first opening exposes the auxiliary layer, and a second opening located in the second dielectric layer, wherein the second opening exposes the top surface of the conductive structure; and a first conductive layer located in the first opening, and a second conductive layer located in the second opening.

2. The semiconductor structure according to claim 1, wherein:

the substrate includes a base, the gate structure located over the base, and an interlayer dielectric layer located over the base, wherein the interlayer dielectric layer is also located over a sidewall of the gate structure and exposes the top surface of the gate structure.

3. The semiconductor structure according to claim 2, wherein:

the substrate further includes a source/drain layer located in the substrate on two sides of the gate structure, wherein a bottom of the conductive structure is deep into the substrate and is located over a surface of the source/drain layer.

4. The semiconductor structure according to claim 1, wherein:

a material of the covering layer includes metal.

5. A method of forming a semiconductor structure, comprising:

providing a substrate;

forming a gate structure located over the substrate;

forming a covering layer over a part of the substrate, the covering layer located over a top surface of the gate structure and being in contact with the top surface of the gate structure;

using a first selective deposition process to form an auxiliary layer over a surface of the covering layer;

forming a first dielectric layer over surfaces of the substrate and the auxiliary layer;

forming a conductive structure in the first dielectric layer, wherein a top surface of the first dielectric layer is flush with a top surface of the conductive structure;

forming a second dielectric layer over surfaces of the first dielectric layer and the conductive structure;

forming a first opening and a second opening, wherein the first opening is located in the second dielectric layer and the first dielectric layer, and the first opening exposes the auxiliary layer, and the second opening is located in the second dielectric layer and the second opening exposes the top surface of the conductive structure; and forming a first conductive layer in the first opening and forming a second conductive layer in the second opening, wherein a growth rate of a material of the first conductive layer over a surface of the auxiliary layer is higher than a growth rate of the material of the first conductive layer over the surface of the covering layer.

6. The method according to claim 5, wherein:

a material of the auxiliary layer includes tungsten.

7. The method according to claim 6, wherein:

a process of forming the auxiliary layer includes a chemical vapor deposition process; and process parameters of the chemical vapor deposition process include: reaction gas includes tungsten hexafluoride and hydrogen, and reaction temperature ranges from 300 degrees Celsius to 400 degrees Celsius.

8. The method according to claim 5, wherein:

the substrate includes a base, the gate structure located over the base, and an interlayer dielectric layer located over the base, wherein the interlayer dielectric layer is also located over a sidewall of the gate structure and exposes the top surface of the gate structure, and the covering layer is located over the top surface of the gate structure.

9. The method according to claim 8, wherein:

the substrate further includes a source/drain layer located in the substrate on two sides of the gate structure, wherein a bottom of the conductive structure is deep into the substrate and is located over a surface of the source/drain layer.

10. The method according to claim 5, wherein:

the covering layer includes first ions, a material of the covering layer includes metal ions, the first ions and the metal ions form first chemical bonds; the auxiliary layer includes the metal ions and second ions, the second ions and the metal ions form second chemical bonds, and bond energy of the second chemical bonds is lower than bond energy of the first chemical bonds.

11. The method according to claim 10, wherein:

the first ions include chloride ions, and the second ions include fluoride ions.

12. The method according to claim 5, wherein:

a process of forming the covering layer includes a selective atomic layer deposition process.

13. The method according to claim 12, wherein:

process parameters of the atomic layer deposition process include: reaction gas includes tungsten chloride and hydrogen, and reaction temperature ranges from 400 degrees Celsius to 500 degrees Celsius.

14. The method according to claim 5, wherein:

a process of forming the first conductive layer and the second conductive layer includes a second selective deposition process.

15. The method according to claim 14, wherein:

process parameters of the second selective deposition process include: reaction gas includes tungsten hexafluoride and hydrogen, and reaction temperature ranges from 300 degrees Celsius to 400 degrees Celsius.

16. The method according to claim 14, wherein:

a process of forming the first conductive layer and the second conductive layer includes: depositing a conductive material layer in the first opening and the second opening until the first opening and the second opening are fully filled; and planarizing the conductive material layer until the second dielectric layer is exposed.

17. The method according to claim 14, wherein:

a growth rate of the conductive material layer over the surface of the auxiliary layer is higher than a growth rate of the conductive material layer over the surface of the conductive structure.

18. The method according to claim 5, wherein:

a material of the first conductive layer and the second conductive layer includes tungsten.

19. The method according to claim 5, wherein:

a thickness of the auxiliary layer ranges from 1 nanometer to 10 nanometers.

20. The method according to claim 5, wherein:
a material of the conductive structure includes cobalt.

* * * * *